United States Patent
Hutchins et al.

(10) Patent No.: US 7,773,326 B2
(45) Date of Patent: *Aug. 10, 2010

(54) METHODS FOR MULTI-CHANNEL DATA DETECTION PHASE LOCKED LOOP ERROR COMBINATION

(75) Inventors: Robert Allen Hutchins, Tucson, AZ (US); Jens Jelitto, Rueschlikon (CH); Sedat Oelcer, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 396 days.

This patent is subject to a terminal disclaimer.

(21) Appl. No.: 11/870,885

(22) Filed: Oct. 11, 2007

(65) Prior Publication Data

US 2009/0097604 A1 Apr. 16, 2009

(51) Int. Cl.
*G11B 5/09* (2006.01)

(52) U.S. Cl. .............................. 360/51; 360/26; 375/376

(58) Field of Classification Search ........................ None
See application file for complete search history.

(56) References Cited

U.S. PATENT DOCUMENTS

| | | | | |
|---|---|---|---|---|
| 4,096,360 A | * | 6/1978 | Takahashi et al. | 369/47.16 |
| 4,353,099 A | * | 10/1982 | Shum et al. | 360/27 |
| 5,206,769 A | * | 4/1993 | Bailey et al. | 360/51 |
| 5,488,516 A | * | 1/1996 | Kalfs et al. | 360/51 |
| 5,786,953 A | * | 7/1998 | Kalfs | 360/51 |
| 5,986,834 A | * | 11/1999 | Colineau et al. | 360/51 |

* cited by examiner

*Primary Examiner*—Jason C Olson
(74) *Attorney, Agent, or Firm*—John H. Holcombe

(57) ABSTRACT

Phase-error combination methods for a multi-channel data detection system with a phase locked loop for each channel, comprises receiving phase error information with respect to each channel; combining the received phase error information and generating a combined phase error; and applying the combined phase error to at least one channel phase locked loop. Error signal combination comprises receiving error information of a signal relevant to a phase locked loop with respect to each channel; combining the received error signal information and generating a combined error signal, weighting the received error signal information from each channel, for example with reliability information. The combined, weighted error signal is applied to at least one channel phase locked loop.

14 Claims, 4 Drawing Sheets

METHODS FOR MULTI-CHANNEL DATA DETECTION PHASE LOCKED LOOP ERROR COMBINATION

DOCUMENT INCORPORATED BY REFERENCE

Commonly assigned U.S. Pat. No. 5,442,315 is incorporated for its showing of phase locked loops used in data detection.

CROSS REFERENCE TO RELATED APPLICATIONS

Commonly assigned U.S. patent application Ser. No. 11/870,853 filed on even date herewith relates to phase-error combination logic for a multi-channel data detection system.

Commonly assigned U.S. patent application Ser. No. 11/870,921 filed on even date herewith relates to frequency error combination logic, which weights the frequency error information, for a multi-channel data detection system.

Commonly assigned U.S. patent application Ser. No. 11/870,934 filed on even date herewith relates to frequency error combination methods, which weight the frequency error information, for multi-channel data detection.

FIELD OF THE INVENTION

This invention relates to multi-channel data detection, and, more particularly, to multiple channels using phase locked loops.

BACKGROUND OF THE INVENTION

Data storage having multiple channels typically employs movable media in which data is recorded on one pass of the media, and the data is read back and detected at a subsequent time, possibly on a different pass of the media, and possibly on a different drive than that which recorded the data. One example of movable media is magnetic tape which has a plurality of parallel tracks for recording. Symbol timing recovery during readback represents one of the most critical functions in data storage read channels. Sampling an analog readback signal at the right time instant is important for achieving good overall performance. Among the challenges presented are the presence of disturbances such as dropout events, instantaneous speed variations, and signal distortion of various origins. As areal recording densities become higher and higher, SNR (signal to noise ratio) margins are decreased, making satisfactory timing recovery an even more challenging task.

Timing recovery typically is based on a PLL (phase locked loop) for each channel whose purpose is to accurately estimate the timing offsets before sampling the analog signal. Problems in this context, especially with degraded channel conditions as explained above, are those of "loss of lock" or "cycle slip". These terms refer to a phase adjustment of the timing control loop that stabilizes around a stable but undesirable operating point that is located one or several symbol interval durations apart from the desired operating point. This phenomenon often results in long bursts of bit and symbol errors which may exceed the error correction capability of the error correction codes, such as Reed-Solomon codes, leading to severe performance degradation or even permanent error situations.

The conventional approaches have been to optimize the operation of the PLL for maximum noise rejection and loop jitter minimization, to increase the loop robustness by using more reliable decisions, etc.

The incorporated '315 patent, inter alia, takes advantage of the multiple channels by providing a global clock which is generated from a global average frequency signal by averaging the content of the frequency error registers employed by the PLLs of the individual channels. The global average frequency is employed by the PLL of each track which adds its own scaled phase error to it.

SUMMARY OF THE INVENTION

Error combination methods related to a multi-channel data detection system, wherein the multi-channel data detection system comprises a phase locked loop for each channel.

In one embodiment, a method for generating phase error comprises receiving phase error information with respect to each channel; combining the phase error information and generating a combined phase error; and applying the combined phase error to at least one channel phase locked loop.

In a further embodiment, the same combined phase error is applied to all the channel phase locked loops.

In a still further embodiment, the combining step comprises averaging the received phase error information from each channel.

In another embodiment, the combining step comprises weighting the received phase error information from each channel wherein each weight comprises a fraction wherein the total of the weight fractions is equal to "1".

In a further embodiment, the weighting step comprises weighting the received phase error information based on reliability information about the channel from which the phase error information is received.

In a still further embodiment, the reliability information about the channel from which the phase error information is received is derived from a comparison of a received signal at a data detector of the channel and an ideal expected signal of the channel.

In another embodiment, the reliability information about the channel from which the phase error information is received is derived from a comparison of the phase of the input signal of a phase locked loop of the channel and the signal phase for the expected bit cell.

In still another embodiment, the reliability information is derived from a data detector of the channel from which the phase error information is received.

In still another embodiment, the combining step comprises weighting the received phase error information from at least one channel on a different basis than received phase error information from other channels.

In a further embodiment, the weighting step comprises weighting the received phase error information from the other channels based on reliability information.

In still another embodiment, error signal combining methods are provided for a multi-channel data detection system, wherein the multi-channel data detection system comprises a phase locked loop for each channel. Error information of a signal relevant to a phase locked loop with respect to each channel is received; and the received error signal information is combined, weighting the received error signal information from each channel; and the combined, weighted error signal is applied to at least one channel phase locked loop.

For a fuller understanding of the present invention, reference should be made to the following detailed description taken in conjunction with the accompanying drawings.

DETAILED DESCRIPTION OF THE INVENTION

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
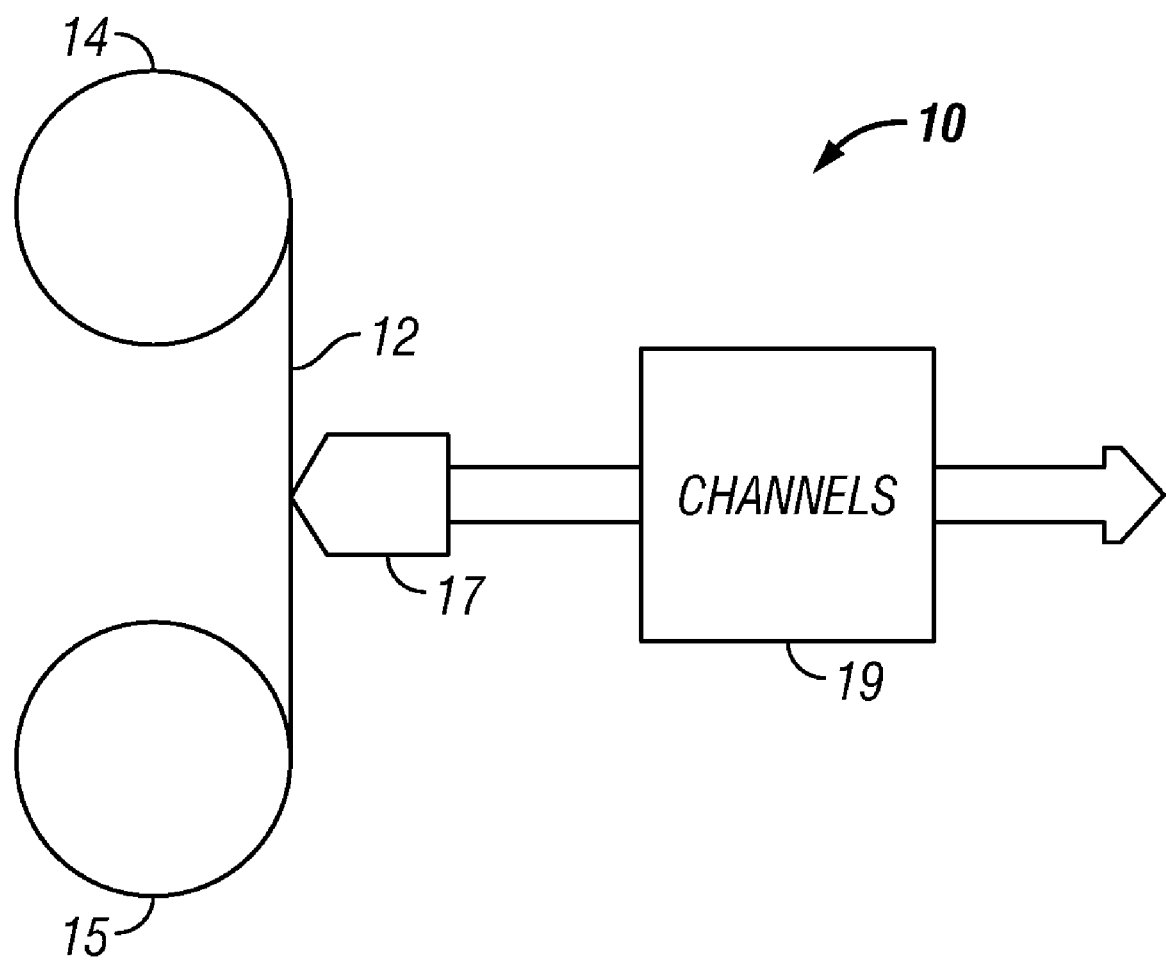
FIG. 1 is a block diagrammatic illustration of a multi-channel detection system which incorporates error combination logic and methods in accordance with the present invention.

Referring to FIG. 1, a multi-channel detection system 10 is illustrated for data storage which, for example employs movable media 12 in which data is recorded on one pass of the media, and the data is read back and detected at a subsequent time, possibly on a different pass of the media, and possibly on a different drive than that which recorded the data. One example of movable media 12 is magnetic tape which has a plurality of parallel tracks for recording and which is wound on reels 14 and 15, for example of a data storage cartridge and/or a data storage drive. A multi-track head 17 reads back the recorded contents of the movable media and supplies the readback signals to multiple channels 19, which detect the data from the readback signals. A channel may be configured to derive information with respect to a track of multi-track head 17.

Figure 2:
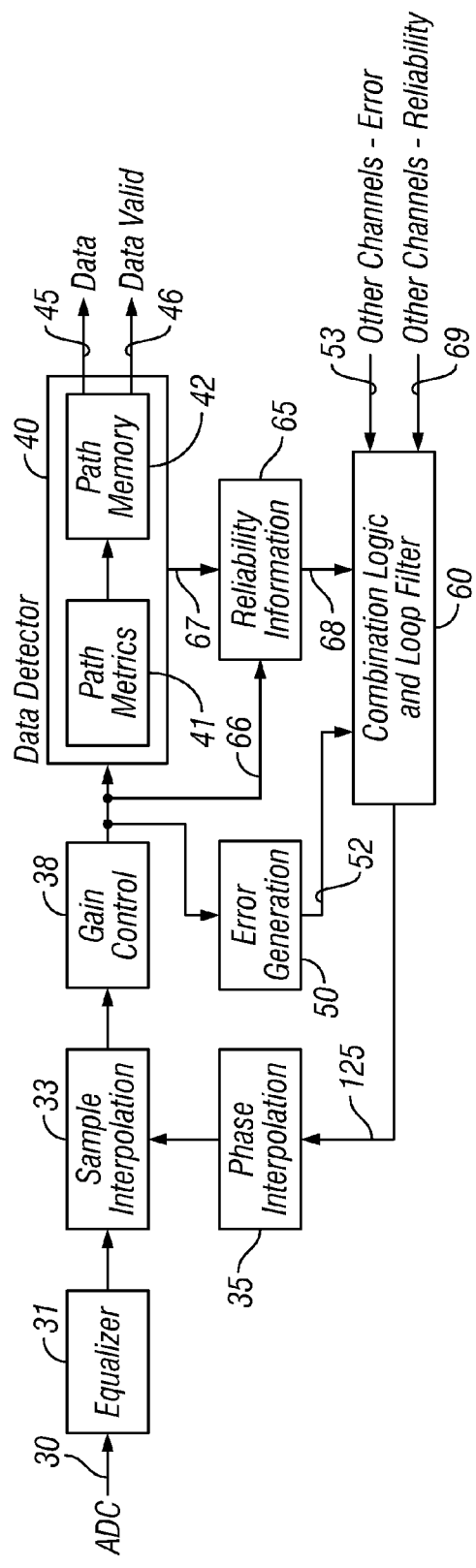
FIG. 2 is a block diagrammatic illustration of an embodiment of one channel of the multi-channel detection system of FIG. 1, wherein an error signal is derived based on a memoryless decision device.
Figure 3:
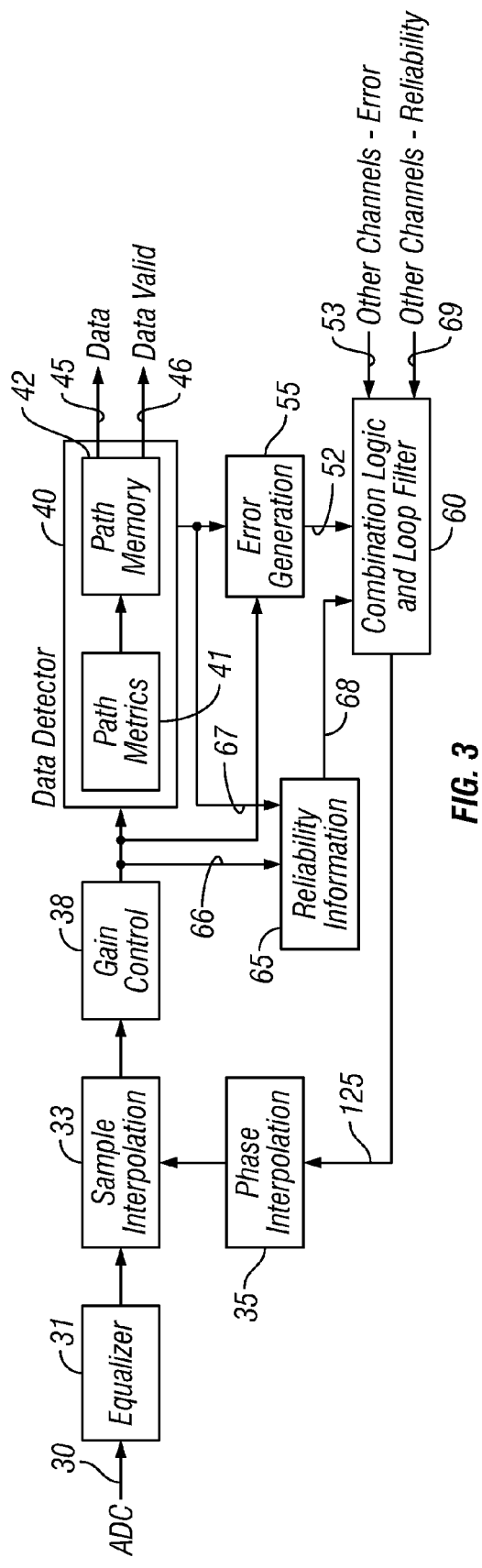
FIG. 3 is a block diagrammatic illustration of an alternative embodiment of one channel of the multi-channel detection system of FIG. 1, wherein an error signal is derived based on a sequence detection device.

Referring to FIGS. 2 and 3, symbol timing recovery of the readback signals represents one of the most critical functions in data storage read channel data detection. Sampling an analog readback signal at the right time instant is important for achieving good overall performance. Among the challenges presented are the presence of disturbances such as dropout events, instantaneous speed variations, and signal distortion of various origins. As areal recording densities become higher and higher, SNR (signal to noise ratio) margins are decreased, making satisfactory timing recovery an even more challenging task.

Timing recovery typically is based on a PLL (phase locked loop) for each channel whose purpose is to accurately estimate the timing offsets before sampling the analog signal. Many versions of PLLs exist, including the PLLs discussed in the incorporated U.S. Pat. No. 5,442,315.

FIGS. 2 and 3 illustrate embodiments of one channel of the multi-channel detection system of FIG. 1 that incorporate error combination logic and methods in accordance with the present invention, wherein an error signal is derived from the signal after timing recovery and gain adjustment. The output signal for a channel from the head 17 of FIG. 1 is converted from analog to digital, for example by an ADC (analog to digital converter), and the stream of digital signals is provided at input 30 in FIGS. 2 and 3. In this architecture, the stream of digital signals has not yet been adjusted in phase or frequency because the ADC is clocked by a free running clock. An equalizer may adjust the signals to compensate, e.g., for the characteristics of the head 17 and/or the media 12, and provides the resultant signals to sample interpolation logic 33. Sample interpolation logic 33 takes the samples of the equalized stream of digital signals and interpolates them so that, ideally, any offset between the frequency and phase of the clock signals used to write and read the data is compensated. To accomplish this signal sample or bit cell timing recovery, all the elements shown in FIGS. 2 and 3 from the output of the sample interpolation 33 to the output of the phase interpolation 35 contribute to the PLL functionality. It requires using the correct set of samples at the time instant considered and interpolating to the right time within the equalized stream of digital signals.

The resultant sample is subjected to gain control 38 to adjust the amplitudes of the samples, and is applied to a data detector 40. One type of data detector is a maximum likelihood sequence detector which compares the incoming signals to defined particular expected signals, thus generating path metrics 41, and maintains a path memory 42 of possible data sequences and selects the data sequence that has the maximum likelihood of being correct. The data is output on line 45, and is indicated as valid 46 when the selection has been made. Various versions of data detectors 40 exist, including alternatives to maximum likelihood sequence detectors.

To achieve interpolating to the right time within the received digital samples involves detecting any phase error still present in the signal after sample interpolation 33 and correcting for it by means of the PLL.

The present invention combines the errors, such as phase-errors or frequency errors, of each of the channels 19 to take advantage of the multiple channels to potentially reduce the influence of dropout events, instantaneous speed variations, and signal distortion of various origins with one or more of the channels, and tend to increase the timing reliability and therefore the reliability of the detected data for each of the channels.

In the example of FIG. 2, an error signal is derived from the signal sample after timing recovery and gain control by error generation logic 50. Examples of error signals are phase-error signals, frequency error signals, and detection error signals, and timing error detection signals, as will be discussed.

In FIG. 2, error signal combination logic and loop filter 60 for one of the channels 19 of FIG. 1 comprises a plurality of error signal inputs 52, 53 configured to receive error signal information with respect to each of the channels 19.

In the example of FIG. 3, an error signal is derived 55 from the signal sample after timing recovery and gain control and from the data detector 40.

In FIG. 3, error signal combination logic and loop filter 60 for one of the channels 19 of FIG. 1 comprises a plurality of error signal inputs 52, 53 configured to receive error signal information with respect to each of the channels 19.

In FIGS. 2 and 3, combination logic and loop filter 60 is configured to combine the error signal information received by the error signal inputs; the combined error signal is filtered by a loop filter which generates a phase adjustment signal 125 to the phase interpolation 35.

In one embodiment, the combination logic within the combination logic and loop filter 60 is configured to average the error signal information received from the channels.

Alternatively, the combination logic within the combination logic and loop filter 60 is configured to weight received error signal information, for example, based on reliability information determined 65 about each channel. The reliability information is related to the samples 66 and may involve information 67 from the data detector 40, as will be discussed. The error signal information that is weighted may comprise information such as phase error information and such as frequency error information.

The reliability information is gathered from the instant channel 68 and the other channels 69. The combination logic within the combination logic and loop filter 60 weights the received error signal information based on the reliability information of the channel from which the error signal information is received. The weighting is such that the less reliable error signal information is given less weight.

Alternatively, the weighting is such that the error signal information of the instant channel 52 is arbitrarily given more weight, while the weighting of the other channels 53 is given less weight. The error signal weighting of the other channels may be based upon the reliability information.

Alternatively, some or all of the weighting may be chosen according to some other criterion. For example, error signals from channels that are based on heads that are near the outer extremes of the media may be weighted less than the remainder of the error signals.

Figure 4:
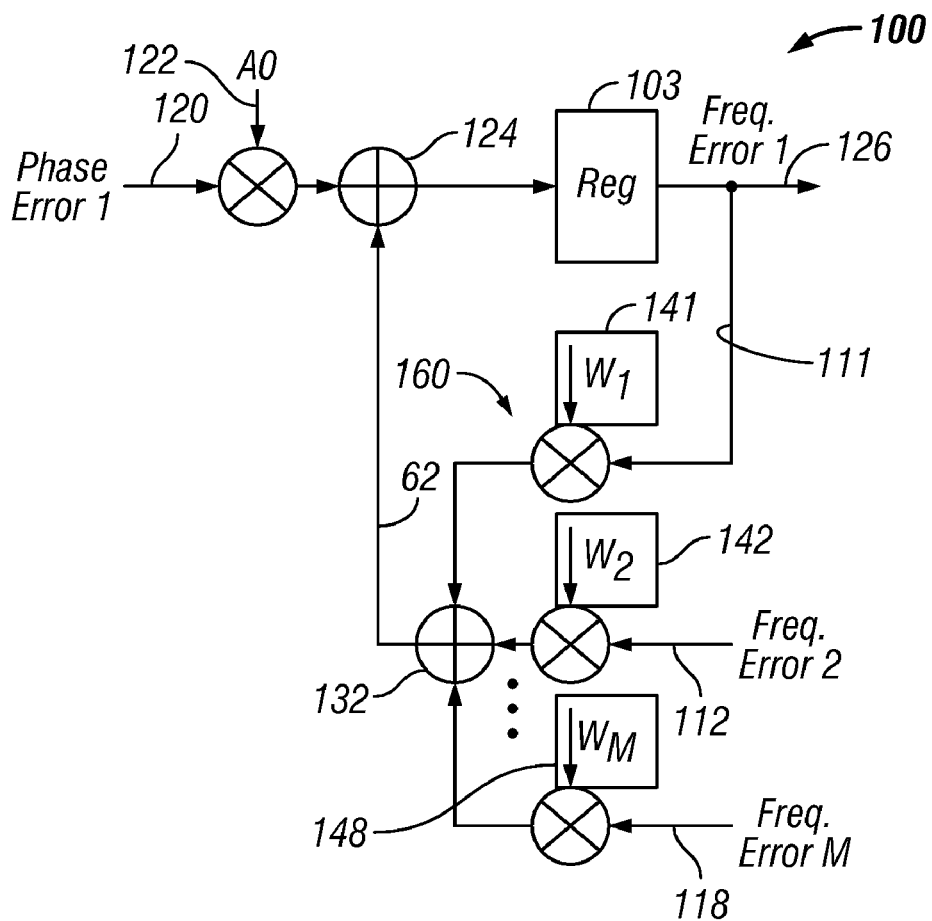
FIG. 4 is a block diagrammatic illustration of frequency-error combining at a channel of FIG. 1.

Referring to FIG. 4, elements of a PLL 100 are illustrated for a single channel in which the PLL frequency error register 103 is adjusted by a combined error signal where the error signal is the weighted frequency error 111, 112 ... 118 of each of the channel PLLs. The frequency error register stores the frequency offset, which represents the frequency error, relative to the symbol duration or bit cell size. For example, if the media was running 10% fast, the received symbol duration or bit cell size is 10% smaller, the frequency error register would store that value (equivalent to 90% of nominal). Similarly, if the media was running 10% slow, the received symbol duration or bit cell size is 10% larger, and the frequency error register would store that value (equivalent to 110% of nominal). The frequency error register allows the PLL to track a constant frequency error to zero steady state error.

A predetermined gain 122 is applied to the phase error 120 and the resulting scaled phase error is submitted to an adder 124 and the output of the adder is submitted to the frequency error register 103. For a second order PLL, for example, the phase error 120 is also multiplied by another gain and the resulting signal is added to the frequency error signal 126. The resultant adjusted phase is supplied at output 125 to the phase interpolation 35 of FIGS. 2 and 3.

The PLL frequency error register 103 is adjusted by a combination of weighted frequency errors 111, 112 ... 118 of each of the channels. The weighting of received frequency error information is based, for example, on reliability information about the channel from which the frequency error information is received. Thus, if the particular channel is less reliable, the frequency error information from that channel is given less weight than that from the other channels.

In FIG. 4, frequency error inputs 111, 112 ... 118 are configured to receive frequency error information with respect to each channel. Combination logic 160 is configured to combine the frequency error information received by the frequency error inputs 111, 112 ... 118 and generate a combined error 62 using an adder 132, weighting the received frequency error information from each channel. A combined error output 62 is configured to apply the combined error to the channel phase locked loop at adder 124.

The weighting information may comprise reliability information, for example, based on SNR (signal to noise ratio) information. An example of a SNR is 10×log(signal power/noise power) or 20 log×(signal amplitude/noise amplitude). In each case absolute values are used. Specific examples comprise reliability information derived from a comparison of a received signal at a data detector of the channel from which the frequency error information is received and an ideal expected signal of the channel (herein called "SNRd" where "d" indicates detection); or comprise reliability information derived from a comparison of the phase of the input signal of a phase locked loop of the channel from which the frequency error information is received and the signal phase of the expected bit cell (herein called "SNRj" where "j" indicates jitter). Alternatively, the reliability information comprises detection reliability information derived from a data detector of the channel from which the frequency error information is received. The detection reliability may, for example, be generated by the soft output Viterbi algorithm (SOVA), the Bahl-Cocke-Jelinek-Raviv (BCJR) algorithm for maximum a posteriori detection, or other similar algorithms well known to those skilled in the art. Similar reliability information may be generated by a soft decoder in case data is encoded before being written on the medium. For example, soft reliability information generated by decoders for turbo codes or for low-density-parity-check codes can be used. In this case, the data decoder (not shown in FIG. 2 and FIG. 3) is an element that follows the data detector, as is well known to those skilled in the art.

In the case of SNRd, a comparison is done in the detector comparing the received signal with the ideal expected signal. For example, in the case of magnetic tape "PR4" detection, the synchronous samples received at the detector should be $\{-2, 0, +2\}$. If a sequence of data was instead ... 2.1, 0.1, $-0.2, -2.3, 0.2$ ..., the signal is ... 2, 0, 0, $-2, 0$ ..., and the noise is ... 0.1, 0.1, $-0.2, -0.3, 0.2$ .... The SNRd=20 log((... 2+0+0+2+0 ...)/(... 0.1+0.1+0.2+0.3+0.2 ...)).

In the case of SNRj, the comparison is done in the PLL. The signal power is the size of the bit cell, which is normalized to one. The noise is the phase-error, which is the difference between the phase of the input signal and the center of the bit cell (½). For an ideal signal, a received sequence would be ... 0.5, 0.5, 0.5, 0.5, 0.5 .... If there is noise, it might look like ... 0.6, 0.4, 0.5, 0.7, 0.2 ..., and the phase error (noise) would be ... 0.1, $-0.1$, 0.0, 0.2, $-0.3$ .... The SNRj=20 log((... 1+1+1+1+1 ...)/(... 0.1+0.1+0.0+0.2+0.3 ...)).

It is possible to evaluate the reliability of the error signal information by the soft reliability information discussed above, or by examining the data detector and/or data decoder employing the probability of errors or the number of bits found to be in error by an error correction capability.

The weighting from each channel may comprise a fraction wherein the total of the weight fractions is equal to "1". An example of a weighting formula at time k for channel m comprises:

$$w_{k,m} = REL_{k,m} \bigg/ \sum_{n=1}^{M} REL_{k,n}$$

where "REL" is the measure of reliability and M is the number of channels.

The weighting may be based on being greatest for the channel having the largest value of the reliability information, meaning, for example, the SNR or data error probability closest to zero.

Referring to FIG. 4, the frequency error at input 111 for channel 1 is weighted by the weighting 141 for that channel; the frequency error at input 112 for channel 2 is weighted by the weighting 142 for that channel; . . . and the frequency error at input 118 for channel M is weighted by the weighting 148 for that channel.

Figure 5:
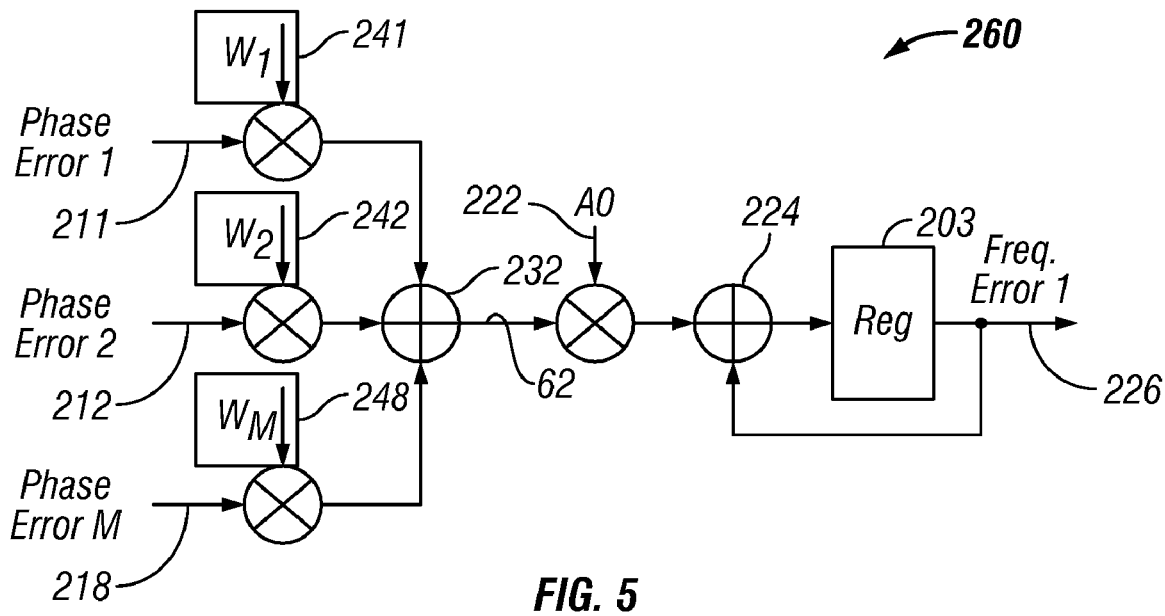
FIG. 5 is a block diagrammatic illustration of phase-error combining at a channel of FIG. 1.

In FIG. 5, phase-error inputs 211, 212 . . . 218 are configured to receive phase error information with respect to each channel. Combination logic 260 is configured to combine 232 the phase error information received by the phase-error inputs 211, 212 . . . 218 and generate a combined error, and a combined error output 62 is configured to apply the combined error to the phase locked loop of the channel, replacing the direct phase error 211 for the channel.

In one embodiment, the phase-error inputs may be combined by averaging the phase errors that are combined, for example by giving each an equal weight.

As discussed above, the weighting may be wholly or partially heuristic or wholly or partially based on reliability information, for example, based on SNR (signal to noise ratio) information, such as SNRd or SNRj, also illustrated by the above-described examples. Alternatively, the reliability information comprises detection reliability information derived from a data detector of the channel from which the phase error information is received, or it comprises the decoding reliability information for a coded recording system.

Referring to FIG. 5, the phase error at input 211 for channel 1 is weighted by the weighting 241 for that channel; the phase error at input 212 for channel 2 is weighted by the weighting 242 for that channel; . . . and the phase error at input 218 for channel M is weighted by the weighting 248 for that channel.

As discussed above, the weighting from each channel may comprise a fraction wherein the total of the weight fractions is equal to "1".

In FIG. 5, a predetermined gain 222 is applied to the combined error 62 and the scaled combined error is submitted to an adder 224 and the output of the adder is submitted to the frequency error register 203. For a second order PLL, for example, the phase error 211 is also multiplied by another gain and the resulting signal is added to the frequency error signal 226. The resultant adjusted phase is supplied at output 125 to the phase interpolation 35 of FIGS. 2 and 3.

The frequency error register 203 is similar to frequency error register 103 of FIG. 4, and, in FIG. 5, frequency error register 203 comprises a feedback of the frequency error which is added 224 to the scaled combined error to adjust the frequency offset over time.

In the above descriptions, delays to match circuit and system delays are not shown.

Figure 6:
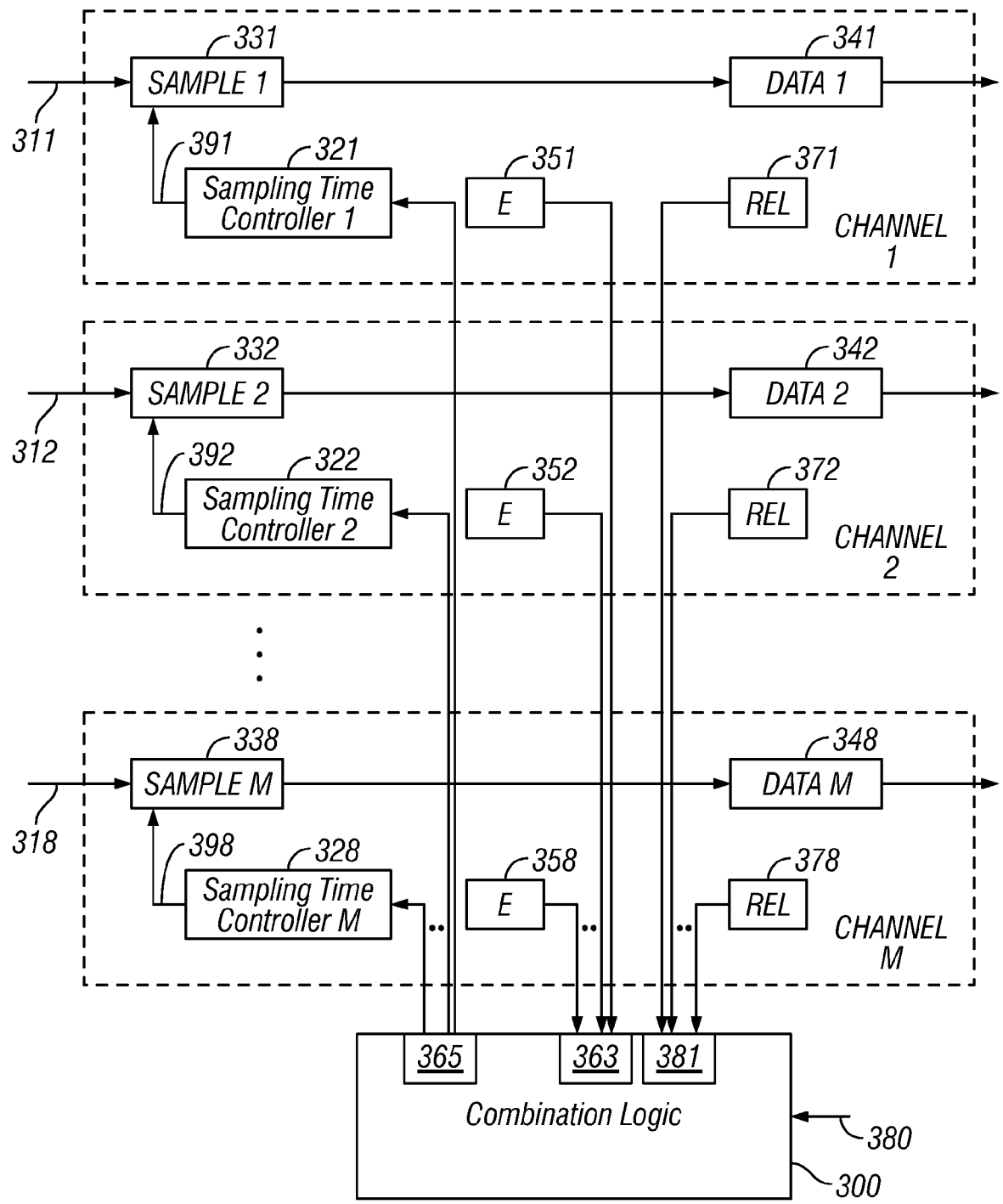
FIG. 6 is a block diagrammatic illustration of an embodiment of error combining logic and methods of FIG. 1.

Referring to FIG. 6, combination logic 300 is employed, rather than being distributed as shown above.

FIG. 6 illustrates an embodiment for the channels of the multi-channel detection system of FIG. 1 that incorporate error combination logic and methods in accordance with the present invention, wherein an error signal is derived from the samples after timing recovery and gain control. The output signal for a channel from the head 17 of FIG. 1 is converted from analog to digital, an equalizer may adjust the signals to compensate, e.g., for the characteristics of the head 17 and/or the media 12, and provides the resultant signals 311, 312 . . . 318 to sampling logic 331, 332 . . . 338. Each sampling logic 331, 332 . . . 338 takes two or more samples of the input stream and interpolates the samples of the input stream to determine a sample or intermediate sample that is deemed the representative sample of the desired symbol or bit cell. To accomplish the sampling, the symbol or bit cell timing recovery by the PLLs of each channel represent one of the most critical functions of the detection or read channel. Taking the optimum sample requires using the right set of samples and interpolating to the right time within the received digital samples. As discussed above, many versions of sample logic exist.

The resultant sample is subjected to gain control to adjust the amplitudes of the samples, and applied to a data detector 341, 342 . . . 348. As discussed above, various versions of data detectors 341, 342 . . . 348 exist.

To achieve interpolating to the right time within the received digital samples, the timing of each sampling time controller 321, 322 . . . 328 is adjusted.

The present invention combines the errors, such as phase-errors or frequency errors, of each of the channels to take advantage of the multiple channels to potentially reduce the influence of dropout events and instantaneous speed variations, and signal distortion of various origins with one or more of the channels, and tend to increase the timing reliability and therefore the reliability of the detected data for each of the channels.

In FIG. 6, an error signal for each channel is derived by error generation logic 351, 352 . . . 358. Examples of error signals are detection error signals, and timing error detection signals, as discussed above.

Error signal combination logic for the channels comprises error signal inputs 363 configured to receive error signal information, such as phase-error signal or frequency error signal information, with respect to each of the channels.

Combination logic 300 is configured to combine the error signal information received by the error signal inputs and generate combined error signals. In one embodiment, the same combined error signal is distributed to all of the channels. Alternatively, each combined error signal for each channel is different.

Error signal outputs 365 are configured to apply the combined error signal to the sampling time controllers 321, 322 . . . 328 of all the channels.

In one embodiment, the combination logic 300 is configured to average the received error signal information, and in that instance the same error signal output is provided to each channel sampling time controller.

Alternatively, the combination logic 300 is configured to weight received error signal information arbitrarily or, for example, based on reliability information 371, 372 . . . 378 determined about each channel, and received at inputs 381. The reliability information may be related to the samples 331, 332 . . . 338 and/or the data detector 341, 342 . . . 348, as discussed above. The error signal information that is weighted may comprise information such as phase error information and such as frequency error information.

The combination logic 300 weights the received error signal information based on the reliability information of the channel from which the error signal information is received. The weighting is such that the less reliable error signal information is given less weight.

As discussed above, the weighting may be wholly or partially heuristic or wholly or partially based on reliability information, for example, based on SNR (signal to noise ratio) information, such as SNRd or SNRj. Alternatively, the reliability information comprises detection reliability information derived from a data detector and/or a data decoder of the channel from which the error signal information is received.

Alternatively, the weighting is such that the error signal information of the instant channel is arbitrarily given more weight, while the weighting of one or more of the channels is weighted on a different basis than the other channels. For example, an input 380 may be provided to control the weighting on one or more channels. In one example, a determination may have been made that one channel is "bad" and the error information from that channel is to be given no weight. The error signal weighting of the other channels may be based upon the reliability information.

Alternatively, some or all of the weighting may be heuristic and provided at input 380. For example, error signals from channels that are based on heads that are near the outer extremes of the media may be weighted less than the remainder of the error signals.

The error signal outputs 365 apply the combined error signal(s) to each of the channel sampling time controllers 321, 322 ... 328, and the resultant adjusted phase is supplied from the respective sampling time controllers 321, 322 ... 328 at output 391, 392 ... 398 to the sampling logic 331, 332 ... 338.

Still alternatively, combination logic 300 may comprise different combination and/or weighting for one or all of the sampling time controllers. That is, the combined error signals supplied to sampling time controller 322 may be different than that supplied to sampling time controllers 321 and 328. As one example, the weighting applied to the error signal 352 for combining and supplying to sampling time controller 322 may be different and/or on a different basis than the weighting applied to the error signal 352 for combining and supplying to sampling time controllers 321 and 328.

The invention can take the form of an entirely hardware embodiment, an entirely software embodiment or an embodiment containing both hardware and software elements. In a preferred embodiment, the invention is implemented in hardware. Alternative implementations in software include but are not limited to resident software, microcode, firmware, etc.

Furthermore, the invention can take the form of a computer program product accessible from a computer usable or computer readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer readable medium include a semiconductor or solid state memory, magnetic tape, a removable computer diskette, and random access memory (RAM), a read-only memory (ROM), a rigid magnetic disk and an optical disk. Current examples of optical disks include compact disk-read only memory (CD-ROM), compact disk-read/write (CD-R/W) and DVD.

Logic suitable for storing and/or executing program code will include at least processing capability and memory elements.

Input/output or I/O devices (including but not limited to keyboards, displays, pointing devices, etc.) can be coupled to the system either directly or through communication including intervening private or public networks. The communication links may comprise serial interconnections, such as RS-232 or RS-422, Ethernet connections, SCSI interconnections, ESCON interconnections, FICON interconnections, a Local Area Network (LAN), a private Wide Area Network (WAN), a public wide area network, Storage Area Network (SAN), Transmission Control Protocol/Internet Protocol (TCP/IP), the Internet, and combinations thereof.

Those of skill in the art will understand that changes may be made with respect to the methods discussed above. Further, those of skill in the art will understand that differing specific component arrangements may be employed than those illustrated herein.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A method for generating phase error for at least one channel phase locked loop of a multi-channel data detection system, said multi-channel data detection system comprising a phase locked loop for each channel, comprising the steps of:
   receiving phase error information with respect to each said channel;
   combining said received phase error information and generating a combined phase error; and
   applying said combined phase error to at least one said channel phase locked loop;
   wherein said step of combining said received phase error information comprises weighting said received phase error information from each said channel wherein each weight comprises a fraction wherein the total of said weight fractions is equal to "1".

2. The method of claim 1, wherein said step of weighting said received phase error information comprises weighting said received phase error information based on reliability information about the channel from which said phase error information is received.

3. The method of claim 2, wherein said reliability information comprises reliability information about a channel from which said phase error information is received and is derived from a comparison of a received signal at a data detector of said channel and an ideal expected signal of said channel.

4. The method of claim 2, wherein said reliability information comprises reliability information about a channel from which said phase error information is received and is derived from a comparison of the phase of the input signal of a phased locked loop of said channel and the signal phase of the expected bit cell.

5. The method of claim 2, wherein said reliability information comprises reliability information derived from at least one of a data detector and data decoder of said channel from which said phase error information is received.

6. The method of claim 1, wherein said step of combining said received phase error information comprises weighting said received phase error information from at least one said channel on a different basis than received phase error information from other said channels.

7. The method of claim 6, wherein said step of weighting said received phase error information comprises weighting said received phase error information from said other channels based on reliability information.

8. The method of claim 1, wherein said received phase error information relates to a channel configured to derive information with respect to readback signals of a track of a multi-track head.

9. A method for generating error signal for at least one channel phase locked loop of a multi-channel data detection system, said multi-channel data detection system comprising a phase locked loop for each channel, comprising the steps of:
- receiving error information of a signal relevant to a phase locked loop with respect to each said channel;
- combining said received error signal information and generating a combined error signal, weighting said received error signal information from each said channel; and
- applying said combined, weighted error signal to at least one said phase locked loop;
- wherein said step of weighting said received error signal information comprises weighting is said received error signal information based on reliability information about the channel from which said error signal information is received.

10. The method of claim 9, wherein said reliability information is based on signal to noise ratio (SNR) information.

11. The method of claim 9, wherein said reliability information comprises reliability information derived from a data detector of said channel from which said error signal information is received.

12. The method of claim 9, wherein said step of combining said received error signal information comprises weighting said received error signal information from at least one said channel on a different basis than received error information from other said channels.

13. The method of claim 12, wherein said step of weighting said received error signal information comprises weighting said received error signal information from said other channels based on reliability information.

14. The method of claim 9, wherein said step of receiving error signal information comprises receiving error signal information relating to a channel configured to derive information with respect to readback signals of a track of a multi-track head.

* * * * *